United States Patent

Nowak et al.

[15] 3,668,300

[45] June 6, 1972

[54] PRINTED CIRCUIT WITH SUBSTRATE OF AN OXYBENZOYL POLYESTER

[72] Inventors: Bernard E. Nowak, Lancaster; Steve G. Cottis; James Economy, both of Buffalo, all of N.Y.

[73] Assignee: The Carborundum Company, Niagara Falls, N.Y.

[22] Filed: May 28, 1969

[21] Appl. No.: 828,692

[52] U.S. Cl. ........................174/68.5, 161/231, 161/DIG. 7, 252/64, 260/47 C

[51] Int. Cl. ....................B32b 27/36, H01b 3/42, H05k 1/00

[58] Field of Search ....................161/231, DIG. 7; 174/68.5; 252/64; 260/47 C

[56] References Cited

UNITED STATES PATENTS

| | | | |
|---|---|---|---|
| 3,274,328 | 9/1966 | Davis | 174/68.5 |
| 3,039,994 | 6/1962 | Gleim | 260/47 |
| 3,217,089 | 11/1965 | Beck | 174/68.5 |
| 3,444,131 | 5/1969 | Rosenbrock et al. | 260/47 |

OTHER PUBLICATIONS

Gilkey, R. et al. " Polyesters of Hydroxybenzoic Acids" Journal of Applied Polymer Science, Vol. 2, Issue No. 5, pp. 198–202 (1959).

*Primary Examiner*—John T. Goolkasian
*Assistant Examiner*—Robert A. Dawson
*Attorney*—K. W. Brownell

[57] ABSTRACT

A printed circuit comprising at least one conductor on a substrate of an oxybenzoyl polyester.

6 Claims, 1 Drawing Figure

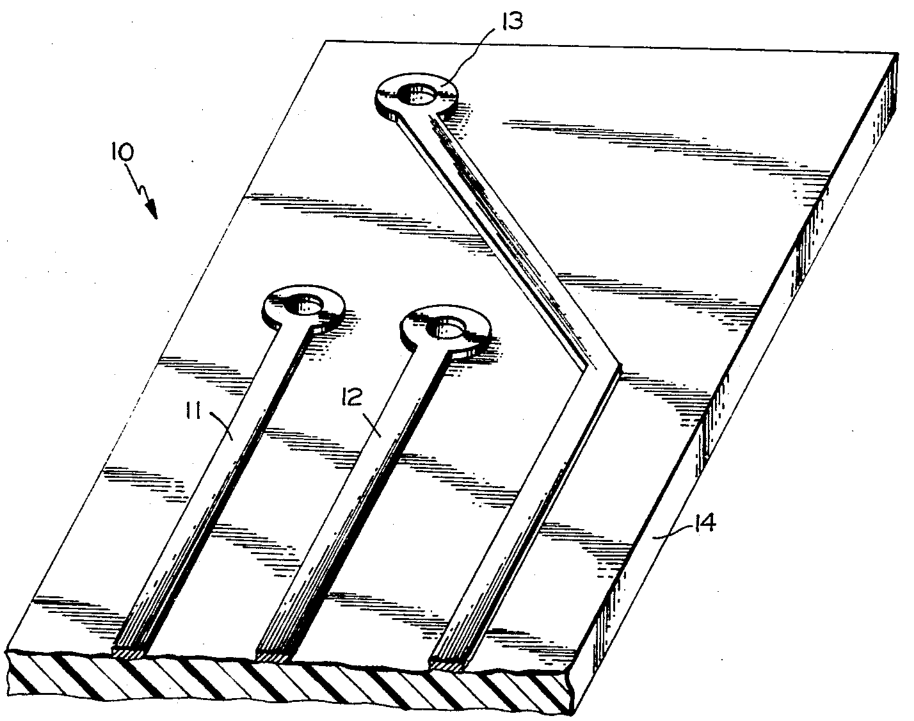
INVENTORS
BERNARD EDWARD NOWAK
STEVE GUST COTTIS
JAMES ECONOMY
BY K.W. Brownell
ATTORNEY

PRINTED CIRCUIT WITH SUBSTRATE OF AN OXYBENZOYL POLYESTER

This invention relates to printed circuits by which is meant an electrical circuit comprising electrical conductors which are carried by a supporting substrate of a suitable dielectric material. The term "printed circuit" as used herein is independent of the process by which the circuit is formed, and refers to those made by processes such as stamping, etching and electro forming.

Considerable effort has been expended in attempting to devise polymers as suitable substrates for use in printed circuits. Such substrates must possess a high dielectric strength, a low dissipation factor, as well as sufficient tensile strength, compressive strength, flexibility, inertness towards solvents and acids, and resistance to thermal degradation.

One class of polymers widely used as printed circuit substrates are the polyesters such as polyethyleneterephthalate. These are disclosed in numerous U. S. patents such as Beck U. S. Pat. No. 3,217,089, Bratton U. S. Pat. No. 3,228,093, Davis U. S. Pat. No. 3,274,328, and Schneble et al U. S. Pat. No. 3,399,268. Polyethylene-terephthalate is in general a linear polyester having recurring units of the formula

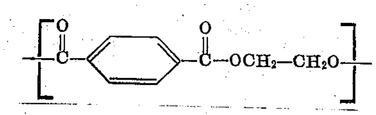

Unfortunately, polyethyleneterephthalate suffers from a number of disadvantages. Its relatively low melting point and low degradation temperature render it unsuitable for use at temperatures above 180°C. For example, it frequently breaks down electrically, creating short circuits when the conductors of the printed circuit carry alternating currents of high frequencies.

It is therefore an object of the present invention to provide an improved printed circuit which is substantially free of one or more of the disadvantages of prior printed circuits.

Another object is to provide a printed circuit having a substrate of a material having a high dielectric strength, a high melting point, and a high resistance to thermal degradation.

A further object is to provide an improved printed circuit which can be employed at high frequencies.

A still further object is to provide an improved printed circuit having a substrate of a material of a low dissipation factor.

Additional objects and advantages of the present invention will be apparent to those skilled in the art by reference to the following detailed description and the single FIGURE of the drawing illustrating one embodiment of the improved printed circuit of the present invention.

According to the present invention as shown in the single figure of the drawing, there is provided a printed circuit 10 comprising at least one conductor such as conductors 11, 12, and 13 which are carried by and preferably attached to a substrate 14 of an oxybenzoyl polyester.

The oxybenzoyl polyesters useful in the present invention are generally those of repeating units of Formula I:

(I)
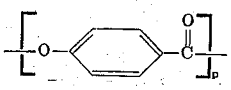

One preferred class of oxybenzoyl polyesters are those of Formula II:

(II)
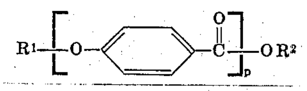

wherein $R^1$ is a member selected from the group consisting of benzoyl, lower alkanoyl, or preferably hydrogen; wherein $R^2$ is hydrogen, benzyl, lower alkyl, or preferably phenyl and $p$ is an integer from 3 to 600 and preferably 30 to 200. These values of $p$ correspond to a molecular weight of about 1,000 to 72,000 and preferably 3,500 to 25,000. The synthesis of these polyesters is described in detail in U.S. Pat. application Ser. No. 619,577 filed March 1, 1967 and now abandoned, entitled "Polyesters Based on Hydroxybenzoic Acids," the disclosure of which is incorporated herein by reference.

Another preferred class of oxybenzoyl polyesters are copolyesters of recurring units of Formulas I, III and IV:

(III)
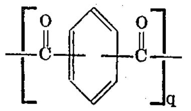

(IV)
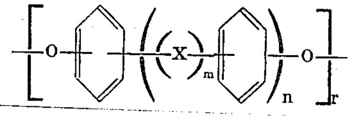

wherein X is —O— or —$SO_2$—; $m$ is 0 or 1; $n$ is 0 or 1; $q{:}r$ = 10:15 to 15:10; $p{:}q$ = 1:100 to 100:1; $p+q+r$ = 3 to 600 and preferably 20 to 200. The carbonyl groups of the moiety of Formula I or III are linked to the oxy groups of a moiety of Formula I or IV; the oxy groups of the moiety of Formula I or IV are linked to the carbonyl groups of the moiety of Formula I or III.

The preferred copolyesters are those of recurring units of Formula V:

(V)
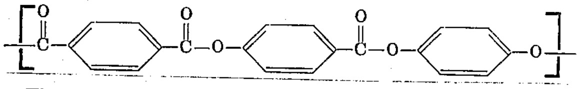

The synthesis of these polyesters is described in detail in U.S. Pat. Application Ser. No. 828,484 filed concurrently herewith entitled "P-Oxybenzoyl Copolyesters" the disclosure of which is incorporated herein by reference.

The polyesters useful in the present invention can also be chemically modified by various means such as by inclusion in the polyester of monofunctional reactants such as benzoic acid or tri– or higher functional reactants such as trimesic acid or cyanuric chloride. The benzene rings in these polyesters are preferably unsubstituted but can be substituted with non-interferring substituents examples of which include among others halogen such as chlorine or bromine, lower alkoxy such as methoxy and lower alkyl such as methyl.

The conductors 11, 12, and 13 can be any electrically conductive material such as copper or silver and can be attached to the substrate 14 by any convenient means such as by vapor deposition or adhesive attachment.

The oxybenzoyl polyesters useful in the present invention can be employed with various fillers of types and in amounts which do not materially affect their properties such as dielectric strength and dissipation factor. Examples of suitable fillers include among others glass fibers, polytetrafluoroethylene, and polyimides.

As used herein "dissipation factor" refers to the ratio of the energy dissipated to the energy stored in the dielectric per cycle of alternating current. Alternatively, it is the tangent of the loss angle. For dissipation factors less than 0.1 such as those of these polyesters, the dissipation factor can be considered equal to the power factor of the dielectric which is the cosine of the phase angle by which the current leads the voltage. See, for example, von Hipple "Dielectric Materials and Applications", John Wiley & Sons, Inc., New York, New York, 1954.

The invention is further illustrated by the following examples in which all parts and percentages are by weight unless otherwise indicated. These nonlimiting examples are illustrative of certain embodiments designed to teach those skilled in the art how to practice the invention and to represent the best mode contemplated for carrying out the invention.

EXAMPLE 1

A mixture of 856 g of phenyl para-hydroxybenzoate, 0.015 g of tetra-n-butyl orthotitanate and 1,800 g of a polychlorinated polyphenyl solvent (b.p. 360–370° C) is heated, with constant stirring and under an atmosphere of flowing nitrogen, at 170–190° C for 4 hours and then at 340–360°C for 10 hours. Early in this heating cycle the mixture becomes a homogeneous liquid. During the heating cycle condensation occurs, accompanied by the distillation of phenol, and the polyester which is produced thereby forms a precipitate. The mixture is cooled to room temperature and extracted with acetone to remove the polychlorinated polyphenyl solvent, and the product is dried overnight in vacuum at 60° C. A yield of 377 g of polyester powder is obtained, consisting essentially of a para-oxybenzoyl polyester.

Example 2

This example illustrates the synthesis of a copolyester useful in the present invention.

The following quantities of the following ingredients are combined as indicated.

| Item | Ingredient | Quantity Grams | Moles |
|---|---|---|---|
| A | P-hydroxybenzoic Acid | 138 | 1 |
| B | Phenyl acetate | 170 | 1.25 |
| C | Therminol 77 | 500 | — |
| D | Diphenyl Terephthalate | 318 | 1 |
| E | Hydrogen Chloride | — | — |
| F | Hydroquinone | 111 | 1.01 |
| G | Therminol 77 | 500 | — |

Items A — D are charged to a four-necked, round bottom flask fitted with a thermometer, a stirrer, a combined nitrogen and HCl inlet and an outlet connected to a condenser. Nitrogen is passed slowly through the inlet. The flask and its contents are heated to 180° C whereupon HCl is bubbled through the reaction mixture. The outlet head temperature is kept at 110°–120° C by external heating during the p-hydroxybenzoic acid, phenyl acetate ester exchange reaction.

The flask and its contents are stirred at 180°C for 6 hours whereupon the HCl is shut off, the outlet head temperature raised to 180°–190° C and the mixture stirred at 220°C for 3.5 hours. Up to this point, 159 grams of distillate are collected in the condenser. Item F is then added and the temperature gradually increased from 220° C to 320° C over a period of 10 hours (10° C/hr.). Stirring is continued at 320° C for 16 hours and then for three additional hours at 340° C to form a slurry. The total amount of distillate, consisting of phenol, acetic acid and phenyl acetate, amounts to 384g. Item G is added and the reaction mixture permitted to cool to 70° C. Acetone (750 ml) is added and the slurry filtered, the solids are extracted in a Soxhlet with acetone to remove items C and G. The solids are dried in vacuo at 110° C overnight whereupon the resultant copolyester (320g, 89.2 percent of theory) is recovered as a granular powder.

EXAMPLE 3

This example illustrates an improved printed circuit of the present invention compared to a printed circuit employing a substrate of polyethyleneterephthalate.

A printed circuit 10 as shown in the drawing is formed of a substrate 14 of polyethyleneterephthalate. A potential of 110 volts 60 cycles per second is impressed across the conductors 11 and 12, whereupon the circuit 10 is placed in a cold oven and the temperature gradually raised. As the temperature is increased, a breakdown in the dielectric strength of the substrate 14 occurs at a temperature of 210° C, causing a short circuit between the conductors 11 and 12.

When the above experiment is repeated identically except that the substrate 14 is the oxybenzoyl polyester of Example 1, dielectric breakdown occurs only at a temperature of 360° C. When the substrate 14 is the oxybenzoyl polyester of Example 2 similar results are obtained.

This example clearly illustrates the superior high temperature characteristics of printed circuits of the present invention compared to those employing a substrate of polyethyleneterephthalate.

EXAMPLE 4

This example illustrates an additional advantage of the printed circuits of the present invention. High frequency alternating currents in the radio frequency and microwave range are passed through conductors 11 and 12 of first a printed circuit 10 having an oxybenzoyl substrate and second a printed circuit having a polyethyleneterephthalate substrate. The latter fails under conditions at which the former functions satisfactorily.

Although the invention has been described in considerable detail with reference to certain preferred embodiments thereof, it will be understood that variations and modifications can be effected within the spirit and scope of the invention as described above and as defined in the appended claims.

What is claimed is:

1. A printed circuit comprising at least one conductor carried by a substrate consisting essentially of an oxybenzoyl polyester of the formula:

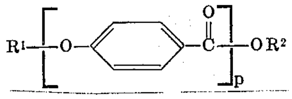

wherein $R^1$ is hydrogen or acetyl and $R^2$ is phenyl and $p$ is an integer from 30 to 200.

2. A printed circuit comprising at least one conductor carried by a substrate consisting essentially of a polyester having recurring units of each of Formulas I, III and IV:

(I)
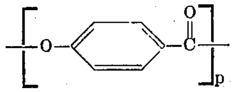

(III)
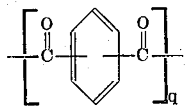

(IV)
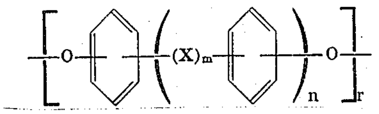

wherein X is —O— or —$SO_2$—; $m$ is 0 or 1; $n$ is 0 or 1; $q:r$ = 10:15 to 15:10; $p:q$ = 1:100 to 100:1; $p+q+r$ = 3 to 600; the carbonyl groups of the moiety of Formula I or III are linked to the oxy groups of the moiety of Formula I or IV; the oxy groups of the moiety of Formula I or IV are linked to the carbonyl groups of the moiety of Formula I or III.

3. The printed circuit of claim 2 wherein the polyester has recurring units of the formula:

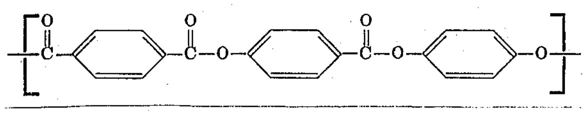

4. The printed circuit of claim 2 wherein $m$ is 0.

5. The printed circuit of claim 2 wherein $n$ is 0.

6. The printed circuit of claim 5 wherein $p + q + r$ = 20 to 200.

* * * * *